(12) United States Patent
Park

(10) Patent No.: US 12,190,973 B2
(45) Date of Patent: Jan. 7, 2025

(54) MEMORY DEVICE PERFORMING SENSING OPERATION AND METHOD OF OPERATING THE SAME

(71) Applicant: SK hynix Inc., Gyeonggi-do (KR)

(72) Inventor: Se Chun Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 29 days.

(21) Appl. No.: 18/325,999

(22) Filed: May 31, 2023

(65) Prior Publication Data
US 2024/0185939 A1    Jun. 6, 2024

(30) Foreign Application Priority Data
Dec. 1, 2022    (KR) .................. 10-2022-0166108

(51) Int. Cl.
| | | |
|---|---|---|
| G11C 29/12 | (2006.01) | |
| G11C 11/4099 | (2006.01) | |
| G11C 16/34 | (2006.01) | |
| G11C 29/02 | (2006.01) | |
| G11C 29/50 | (2006.01) | |
| G11C 29/52 | (2006.01) | |

(52) U.S. Cl.
CPC .... *G11C 29/12005* (2013.01); *G11C 11/4099* (2013.01); *G11C 16/34* (2013.01); *G11C 29/021* (2013.01); *G11C 29/025* (2013.01); *G11C 29/50* (2013.01); *G11C 29/50004* (2013.01); *G11C 29/52* (2013.01); *G11C 2029/1204* (2013.01); *G11C 2207/063* (2013.01)

(58) Field of Classification Search
CPC ............ G11C 29/12005; G11C 29/025; G11C 29/50004; G11C 2029/1204; G11C 29/021; G11C 29/50; G11C 29/52; G11C 2207/063; G11C 11/4099; G11C 16/34
USPC ....... 714/718, 721; 365/185.21, 185.24, 200, 365/201, 210.12
See application file for complete search history.

(56) References Cited

U.S. PATENT DOCUMENTS

| | | | |
|---|---|---|---|
| 8,514,630 B2 * | 8/2013 | Huynh .................. | G11C 29/028 365/185.21 |
| 11,257,559 B1 * | 2/2022 | Choi ....................... | G11C 16/08 |
| 2009/0073781 A1 * | 3/2009 | Fort ........................ | G11C 7/067 365/207 |
| 2011/0235398 A1 * | 9/2011 | Hosono .............. | G11C 13/0028 365/148 |

(Continued)

FOREIGN PATENT DOCUMENTS

| KR | 10-2009-0117710 A | 11/2009 |
|---|---|---|
| KR | 10-2012-0087721 A | 8/2012 |

*Primary Examiner* — John J Tabone, Jr.
(74) *Attorney, Agent, or Firm* — IP & T GROUP LLP

(57) ABSTRACT

The present technology relates to an electronic device. According to the present technology, a memory device may include a plurality of memory cells, a defect detector, and a test controller. The defect detector may generate defect information indicating a defect state in which a value of a cell current measured in a sensing operation on selected memory cells among the plurality of memory cells is less than a threshold value. The test controller may count fail bits from a result of a test operation performed on the selected memory cells using a test reference current in response to the defect information, and set a bit line voltage to be used in the sensing operation based on a comparison result between a number of fail bits detected in the test operation and a reference number.

22 Claims, 9 Drawing Sheets

(56) References Cited

U.S. PATENT DOCUMENTS

2016/0254047 A1* 9/2016 Sun .................... G11C 11/5671
                                                    365/185.03
2022/0051741 A1* 2/2022 Choi ................ G11C 29/12015
2024/0185939 A1* 6/2024 Park .................... G11C 29/025

* cited by examiner

MEMORY DEVICE PERFORMING SENSING OPERATION AND METHOD OF OPERATING THE SAME

CROSS-REFERENCE TO RELATED APPLICATION

The present application claims priority under 35 U.S.C. § 119(a) to Korean patent application number 10-2022-0166108, filed on Dec. 1, 2022, the entire disclosure of which is incorporated herein by reference.

BACKGROUND

1. Field of Invention

Embodiments of the present disclosure relate to an electronic device, and more particularly, to a memory device and a method of operating the same compensating for a value of a cell current by controlling a bit line voltage used in a sensing operation.

2. Description of Related Art

A storage device is a device that stores data under control of a host device such as a computer or a smartphone. A storage device may include a memory device in which data is stored and a memory controller controlling the memory device. The memory device is divided into a volatile memory device and a nonvolatile memory device.

The storage device may include a plurality of memory devices configured in a stack structure. As the number of stacked memory devices increases, a cell current distribution of the memory devices may be deteriorated. The storage device may improve a cell current distribution characteristic by detecting a defective memory device in which a cell current value measured in a sensing operation is less than a threshold value and optimizing a bit line voltage level used in the sensing operation of the defective memory device. The storage device may prevent a peak current from occurring by optimizing only the bit line voltage level of the defective memory device other than a normal memory device.

SUMMARY

An embodiment of the present disclosure provides a memory device and a method of operating the same having improved sensing performance by compensating for a value of a cell current.

According to an embodiment of the present disclosure, a memory device may include a plurality of memory cells, a defect detector, and a test controller. The defect detector may generate defect information indicating a defect state in which a value of a cell current measured in a sensing operation on selected memory cells among the plurality of memory cells is less than a threshold value. The test controller may count fail bits from a result of a test operation performed on the selected memory cells using a test reference current in response to the defect information, and set a bit line voltage to be used in the sensing operation based on a comparison result between a number of fail bits detected in the test operation and a reference number.

According to an embodiment of the present disclosure, a method of operating a memory device may include generating defect information indicating a defect state in which a value of a cell current measured in a sensing operation on selected memory cells among a plurality of memory cells is less than a threshold value, performing a test operation on the selected memory cells using a test reference current in response to the defect information, and setting a bit line voltage to be used in the sensing operation based on a comparison result between a number of fail bits detected in the test operation and a reference number.

According to an embodiment of the present disclosure, a memory device may include a memory cell array, a peripheral circuit, and a control logic. The peripheral circuit may perform a sensing operation on the memory cell array. The control logic may control the peripheral circuit to perform a test operation on the selected memory cells within the memory cell array using a test reference current when a value of a cell current measured in the sensing operation is less than a threshold value, and set a bit line voltage to be used in the sensing operation based on a comparison result between a number of fail bits detected in the test operation and a reference number.

According to an embodiment of the present disclosure, a control circuit may include a defect detector, a test processor, a test information generator, and a parameter setter. The defect detector may generate defect information indicating a defect state in which a value of a cell current measured in a sensing operation is less than a threshold value. The test processor may generate control signals for a test operation of a memory device in response to the defect information. The test operation uses a test reference current higher than a sensing reference current used in the sensing operation. The test information generator may generate test information indicating pass or fail of the test operation based on a comparison result between the number of fail bits detected in the test operation and a reference number. The parameter setter may set parameters related to the sensing operation in response to the test information.

According to an embodiment of the present disclosure, a memory device may include a peripheral circuit and a control logic. The peripheral circuit may measure operation cell currents flowing through respective bit lines coupled to a memory cell group by applying an operation voltage to the bit lines. The control logic may control the peripheral circuit to measure test cell currents flowing through the respective bit lines by applying a test voltage to the bit lines, count, based on the test cell currents, a number of off-cells within the group to determine whether the number is a threshold or less, repeat, by raising the test voltage, the controlling and the counting until the number becomes the threshold or less, and update the operation voltage to the test voltage when the number becomes the threshold or less.

According to the present technology, a memory device and a method of operating the same having improved sensing performance by compensating for a value of a cell current of a defective memory device are provided.

DETAILED DESCRIPTION

Specific structural or functional descriptions of embodiments according to the concept which are disclosed in the present specification are illustrated only to describe the embodiments according to the concept of the present disclosure. The embodiments according to the concept of the present disclosure may be carried out in various forms and should not be construed as being limited to the embodiments described in the present specification or application.

Figure 1:
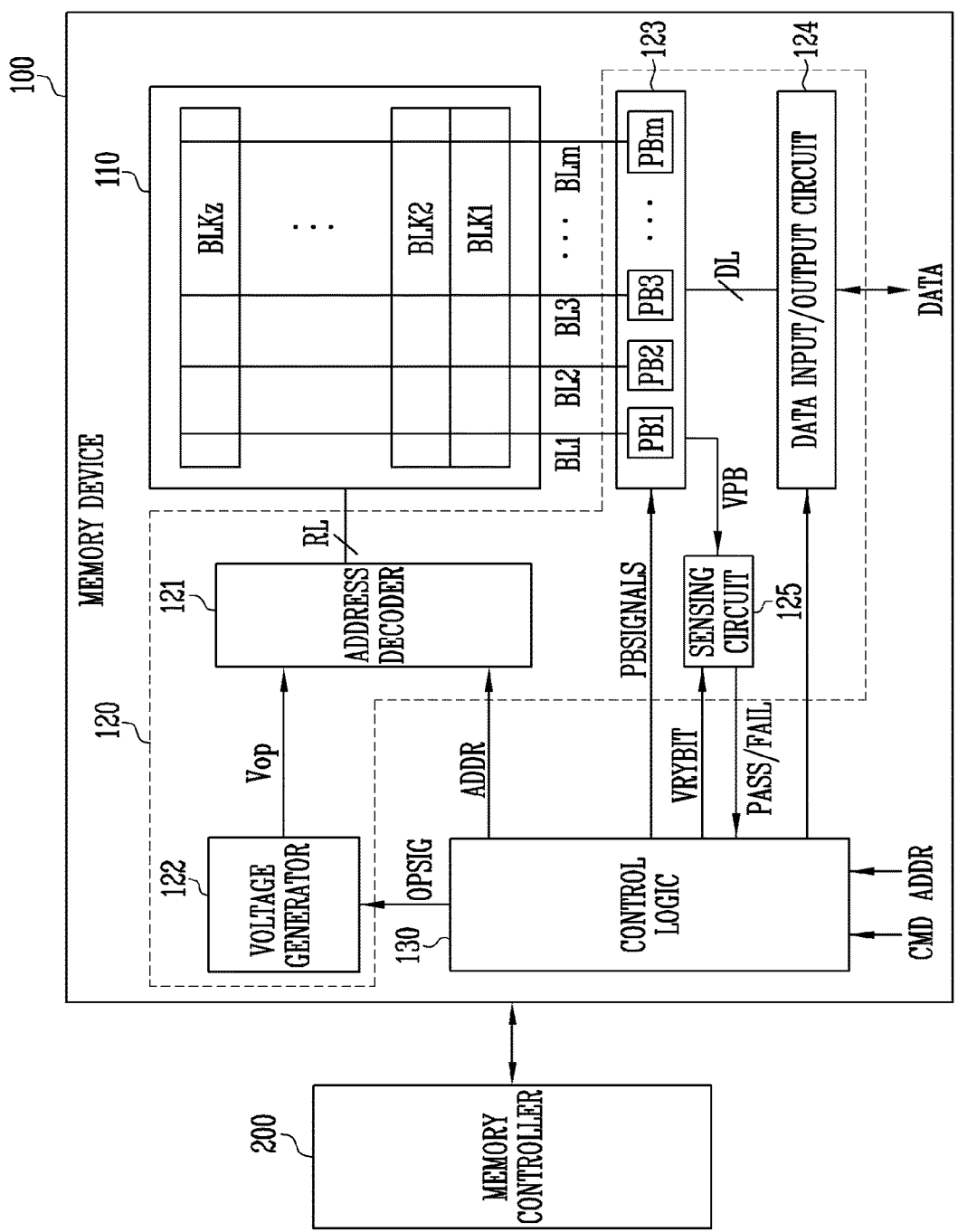
FIG. 1 is a diagram illustrating a structure of a storage device and a memory device according to an embodiment of the present disclosure.

FIG. 1 is a diagram illustrating a structure of a storage device and a memory device according to an embodiment of the present disclosure.

The storage device may include the memory device 100 and a memory controller 200 that controls an operation of the memory device. The storage device is a device that stores data under control of a host.

The storage device may be manufactured as one of various types of storage devices according to a host interface that is a communication method with the host. For example, the storage device may be configured as any of various types of storage devices such as an SSD, an MMC, an eMMC, a secure digital card, a universal serial bus (USB) storage device, a universal flash storage (UFS) device, a peripheral component interconnection (PCI) card type storage device, and a PCI express (PCI-E) card type storage device.

The memory device 100 may store data. The memory device 100 operates under control of the memory controller 200.

The memory device 100 may include a memory cell array 110 including a plurality of memory cells that store data. The memory cell array 110 may include a plurality of memory blocks BLK1 to BLKz. Each memory block may include a plurality of memory cells. One memory block may include a plurality of pages. In an embodiment, the page may be a unit for storing data in the memory device 100 or reading data stored in the memory device 100. The memory block may be a unit for erasing data.

The memory device 100 is configured to receive a command and an address from the memory controller 200 and access an area selected by the address of the memory cell array. That is, the memory device 100 may perform an operation instructed by the command on the area selected by the address. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

The memory controller 200 controls an overall operation of the storage device.

When power is applied to the storage device, the memory controller 200 may execute firmware FW. When the memory device 100 is a flash memory device, the memory controller 200 may operate firmware such as a flash translation layer (FTL) for controlling communication between the host and the memory device 100.

In an embodiment, the memory controller 200 may receive data and a logical block address (LBA) from the host and convert the LBA into a physical block address (PBA) indicating an address of memory cells in which data included in the memory device 100 is to be stored.

The memory controller 200 may control the memory device 100 to perform the program operation, the read operation, or the erase operation in response to a request of the host. During the program operation, the memory controller 200 may provide a write command, a physical block address, and data to the memory device 100. During the read operation, the memory controller 200 may provide a read command and the physical block address to the memory device 100. During the erase operation, the memory controller 200 may provide an erase command and the physical block address to the memory device 100.

In an embodiment, the memory controller 200 may generate and transmit the command, the address, and the data to the memory device 100 regardless of the request from the host. For example, the memory controller 200 may provide the command, the address, and the data to the memory device 100 so as to perform background operations such as a program operation for wear leveling and a program operation for garbage collection.

The memory controller 200 may control a plurality of memory devices 100 connected through at least one or more channels.

The host may communicate with the storage device using at least one of various communication standards or interfaces such as a universal serial bus (USB), a serial AT attachment (SATA), a small computer system interface (SCSI), a peripheral component interconnection (PCI), a PCI express (PCIe), a nonvolatile memory express (NVMe), and a universal flash storage (UFS).

Specifically describing the structure of the memory device 100, the memory device 100 may include the memory cell array 110, a peripheral circuit 120, and a control logic 130.

The memory cell array 110 includes the plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. In an embodiment, the plurality of memory cells are nonvolatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may include the address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address of the received address ADDR. The address decoder 121 may select at least one word line among word lines of a selected memory block according to the decoded address. The address decoder 121 may apply an operation voltage Vop received from the voltage generator 122 to the selected word line.

During the program operation, the address decoder 121 may apply a program voltage to a selected word line and apply a pass voltage of a level lower than that of the program voltage to unselected word lines. During a program verify operation, the address decoder 121 may apply a verify voltage to the selected word line and apply a verify pass voltage of a level higher than that of the verify voltage to the unselected word lines.

During the read operation, the address decoder 121 may apply a read voltage to the selected word line and apply a read pass voltage of a level higher than that of the read voltage to the unselected word lines.

According to an embodiment of the present disclosure, the erase operation of the memory device 100 is performed in a memory block unit. The address ADDR input to the memory device 100 during the erase operation includes a block address. The address decoder 121 may decode the block address and select at least one memory block according to the decoded block address. During the erase operation, the address decoder 121 may apply a ground voltage to the word lines input to the selected memory block.

According to an embodiment of the present disclosure, the address decoder 121 may be configured to decode a column address (not shown) of the transmitted address ADDR. The decoded column address may be transmitted to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors in response to the control logic 130 to generate the plurality of operation voltages Vop. The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, when the program voltage is applied to the selected word line, the first to m-th page buffers PB1 to PBm may transmit the data DATA received through the data input/output circuit 124 to the selected memory cells through the bit lines BL1 to BLm. The memory cells of the selected page are programmed according to the transmitted data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL1 to BLm and store the read data DATA in the first to m-th page buffers PB1 to PBm.

During the erase operation, the read and write circuit 123 may float the bit lines BL1 to BLm. In an embodiment, the read and write circuit 123 may include a column select circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transmitted from the first to m-th page buffers PB1 to PBm included in the read and write circuit 123 to the external controller.

During the read operation or the verify operation, the sensing circuit 125 may generate a reference current in response to a signal of an allowable bit VRYBIT generated by the control logic 130 and may compare a sensing voltage VPB received from the read and write circuit 123 with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be referred to as a control circuit. The control logic 130 may be configured to control all operations of the memory device 100. The control logic 130 may operate in response to a command CMD transmitted from an external device. The control logic 130 may be configured of software, hardware, or a combination thereof, and may be referred to as a control circuit.

The control logic 130 may generate various signals in response to the command CMD and the address ADDR to control the peripheral circuit 120. For example, the control logic 130 may generate an operation signal OPSIG, the address ADDR, a read and write circuit control signal PBSIGNALS, and the allowable bit VRYBIT in response to the command CMD and the address ADDR. The control logic 130 may output the operation signal OPSIG to the voltage generator 122, output the address ADDR to the address decoder 121, output the read and write control signal to the read and write circuit 123, and output the allowable bit VRYBIT to the sensing circuit 125. In addition, the control logic 130 may determine whether the verify operation is passed or failed in response to the pass or fail signal PASS/FAIL output by the sensing circuit 125.

In an embodiment, the memory device 100 may determine whether a value of a cell current measured in a sensing operation on the memory cells included in the memory cell array 110 is less than a threshold value. As a result of the determination, when the value of the cell current is less than the threshold value, the memory device 100 may perform a test operation on the memory cells using a test reference current. The test operation may be an operation of performing the sensing operation using a test reference current higher than a sensing reference current. The memory device 100 may count the number of fail bits from a result of the test operation.

The memory device 100 may repeatedly perform the test operation while increasing a bit line voltage to be used in the test operation until the number of fail bits detected in the test operation is equal to or less than a reference number. When the test operation is passed, the memory device 100 may set the bit line voltage used in the passed test operation as a bit line voltage to be used in the sensing operation. The bit line voltage used in the passed test operation may be a target bit line voltage. For example, the memory device 100 may correct information on a default bit line voltage to information on the target bit line voltage in a system block that stores information on a voltage used in the sensing operation. The test operation may be performed by the peripheral circuit 120 under the control of the control logic 130. Counting the number of fail bits from a result of the test operation may be performed by the control logic 130. Setting the bit line voltage according to a result of the test operation may be performed by the control logic 130. A structure and an operation of the control logic 130 are described in detail with reference to FIG. 2.

Figure 2:
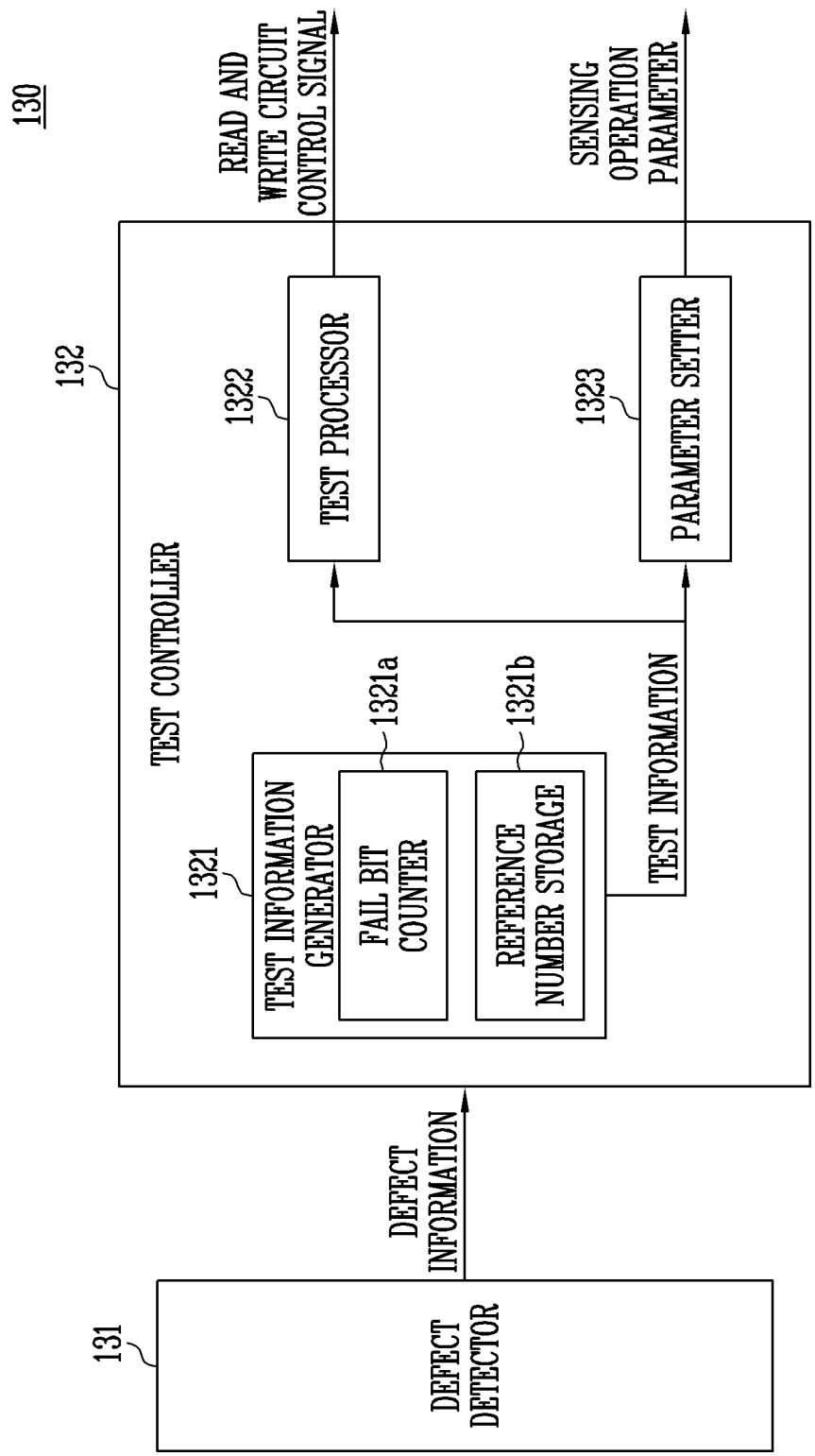
FIG. 2 is a diagram illustrating a structure and an operation of a control logic of FIG. 1.

FIG. 2 is a diagram illustrating the structure and the operation of the control logic of FIG. 1.

Referring to FIG. 2, the control logic 130 may include a defect detector 131 and a test controller 132.

The defect detector 131 may generate defect information indicating a defect state when the value of the cell current measured in the sensing operation on the memory cells is less than the threshold value.

The test controller 132 may control the peripheral circuit to perform the test operation on the memory cells using the test reference current in response to the defect information. The test operation may be the operation of performing the sensing operation using the test reference current higher than the sensing reference current. The test controller 132 may count the number of fail bits from a result of the test operation.

The test controller 132 may set the bit line voltage to be used in the sensing operation based on the comparison result between the number of failed bits detected in the test operation and the reference number. When the number of fail bits exceeds the reference number, the test controller 132 may perform the test operation again using a bit line voltage higher than the bit line voltage used in a previous test operation. The test controller 132 may repeatedly perform the test operation while increasing the bit line voltage used in the test operation until the number of fail bits is equal to or less than the reference number.

After repeating the test operation, the test controller 132 may end the test operation when the number of fail bits detected in the test operation is equal to or less than the reference number. The test controller 132 may set the bit line voltage used in a last one of the repeated test operations as the bit line voltage to be used in the sensing operation.

The test controller 132 may store the information on the target bit line voltage in the system block. The system block may be a memory block that stores information on the default bit line voltage used in the sensing operation. For example, the test controller 132 may correct the information on the default bit line voltage to the information on the target bit line voltage in the system block.

In an embodiment, the test controller 132 may include a test information generator 1321, a test processor 1322, and a parameter setter 1323.

The test information generator 1321 may generate test information indicating pass or fail of the test operation based on a comparison result between the number of fail bits detected from the test operation and the reference number. When the number of fail bits is equal to or less than the reference number, the result of the test operation may be pass. When the number of fail bits exceeds the reference number, the result of the test operation may be fail.

The test information generator 1321 may include a fail bit counter 1321a and a reference number storage 1321b. The fail bit counter 1321a may count the number of fail bits from a result of the test operation performed using the test reference current. The reference number storage 1321b may store a value of the reference number set for determining pass or fail of the test operation.

The test processor 1322 may control the read and write circuit described with reference to FIG. 2 to perform the test operation using the test reference current higher than the sensing reference current used in the sensing operation in response to the defect information. The test processor 1322 may control the read and write circuit to repeatedly perform the test operation while increasing the bit line voltage used in the test operation in response to the test information. The test processor 1322 may provide a read and write circuit control signal instructing the test operation to the read and write circuit.

The parameter setter 1323 may set parameters related to the sensing operation in response to the test information. The sensing operation parameters may include at least one of a level of the bit line voltage used in the sensing operation and a time for measuring the cell current. The parameter setter 1323 may correct existing sensing operation parameters stored in the system block to new sensing operation parameters. The parameter setter 1323 may store sensing operation parameters including a level of the bit line voltage used in the last test operation in the system block.

Figure 3:
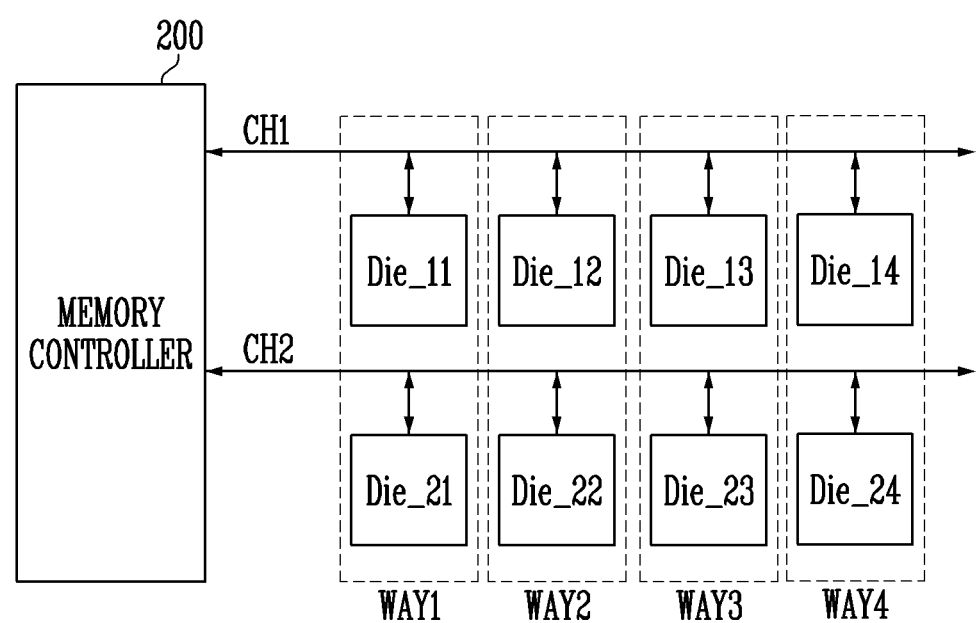
FIG. 3 is a diagram illustrating a plurality of memory devices and a memory controller that controls the plurality of memory devices according to an embodiment of the present disclosure.

FIG. 3 is a diagram illustrating a plurality of memory devices and a memory controller that controls the plurality of memory devices according to an embodiment of the present disclosure.

Referring to FIG. 3, the memory controller 200 may be connected to a plurality of memory devices Die_11 to Die_24 through a first channel CH1 and a second channel CH2. The number of channels or the number of memory devices connected to each channel is not limited to the present embodiment.

The memory devices Die_11 to Die_14 may be commonly connected to the first channel CH1. The memory devices Die_11 to Die_14 may communicate with the memory controller 200 through the first channel CH1.

Since the memory devices Die_11 to Die_14 are commonly connected to the first channel CH1, only one memory device may communicate with the memory controller 200 at once. However, an internal operation of each of the memory devices Die_11 to Die_14 may be simultaneously performed.

Memory devices Die_21 to Die_24 may be commonly connected to the second channel CH2. The memory devices Die_21 to Die_24 may communicate with the memory controller 200 through the second channel CH2.

Since the memory devices Die_21 to Die_24 are commonly connected to the second channel CH2, only one memory device may communicate with the memory controller 200 at once. An internal operation of each of the memory devices Die_21 to Die_24 may be simultaneously performed.

The storage device using the plurality of memory devices may improve performance by using data interleaving, which is data communication using an interleave method. The data interleaving may be performing a data read or write operation while moving between ways in a structure in which one channel is shared by two or more ways. For the data interleaving, the memory devices may be managed in a channel and way unit. In order to maximize parallelism of the memory devices connected to each of the channels, the memory controller 200 may distribute and allocate a continuous logical memory area into the channel and the way.

Figure 4:
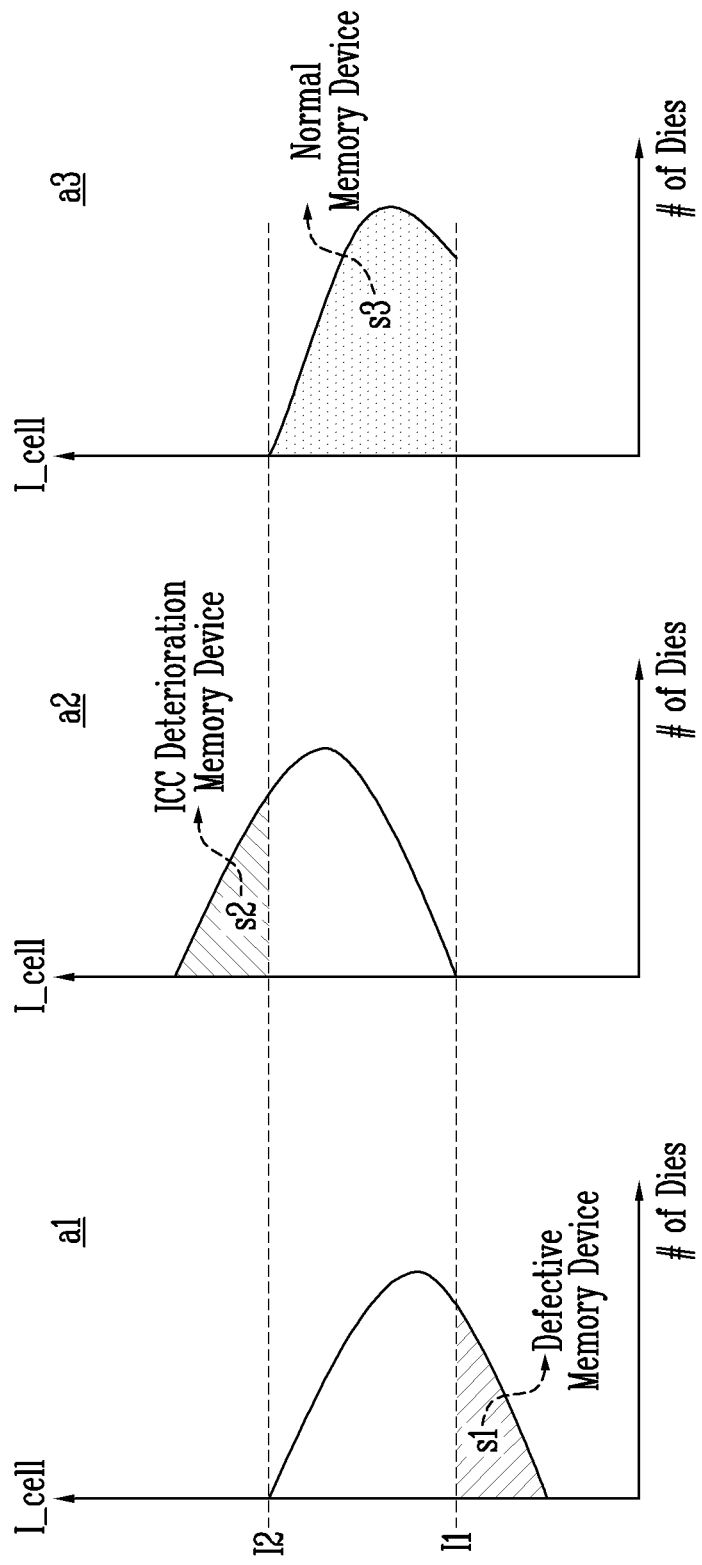
FIG. 4 is a diagram illustrating the memory device according to a value of a cell current according to an embodiment of the present disclosure.

FIG. 4 is a diagram illustrating the memory device according to the value of the cell current according to an embodiment of the present disclosure.

Referring to FIG. 4, classification of the memory device according to the value of the cell current measured in the sensing operation may be shown.

The storage device may include a plurality of memory devices configured in a stack structure. As the number of stacked memory devices increases, a cell current distribution of the memory devices may be deteriorated.

I1 and I2 may be threshold values of the cell current. I1 may be a first threshold value and I2 may be a second threshold value. A memory device of which the value of the cell current is less than I1 may be classified as a defective memory device. Reliability of the sensing operation may be a problem in a case of the defective memory device. A memory device of which the value of the cell current is between I1 and I2 may be classified as a normal memory device. A memory device of which the value of the cell current is greater than I2 may be classified as a memory device of which an ICC is deteriorated. The ICC may be an operation current of the memory device.

In a1, a distribution of the memory device according to the value of the cell current may be shown. In a1, the storage device may increase the bit line voltage used during the sensing operation higher than a default value in order to reduce the number of defective memory devices. In all memory devices, when the bit line voltage used during the sensing operation is increased, a cell current distribution of the memory devices may be changed from a1 to a2.

In a2, total power consumption of the storage device may increase due to the memory device of which the ICC is deteriorated. Therefore, in order to reduce unnecessary power consumption and a peak current, the bit line voltage used during the sensing operation may be increased only for the defective memory device rather than for all memory devices. In this case, the cell current distribution of the memory devices may be changed from a1 to a3.

In a3, an ideal cell current distribution of the memory devices may be shown. According to an embodiment of the present disclosure, the storage device may improve reliability of the sensing operation of the defective memory device while reducing unnecessary power consumption by increasing the bit line voltage used during the sensing operation for only the defective memory device rather than for all memory devices.

Figure 5:
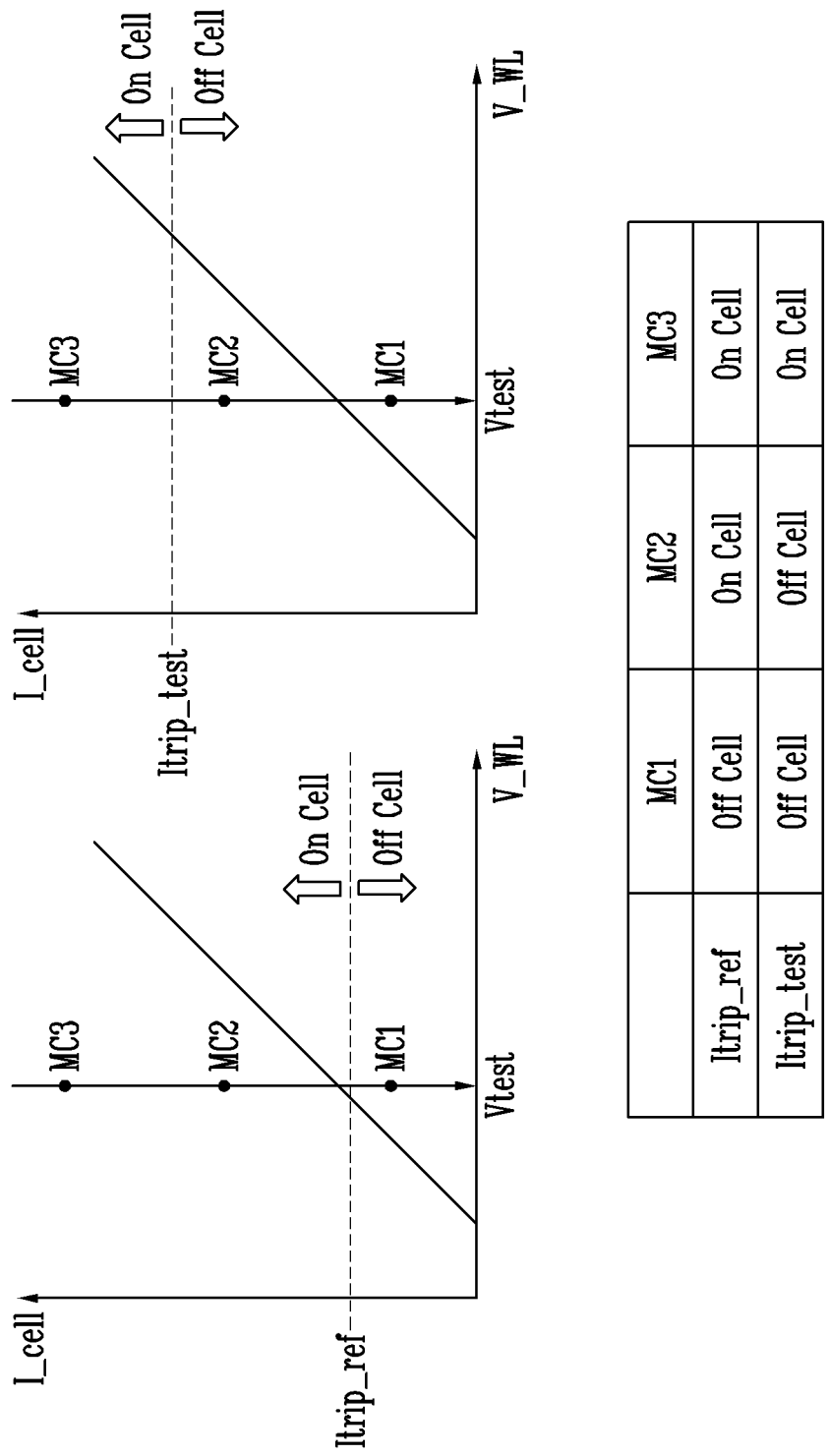
FIG. 5 is a diagram illustrating a read result of a memory cell according to a sensing reference current and a test reference current according to an embodiment of the present disclosure.

FIG. 5 is a diagram illustrating a read result of the memory cell according to the sensing reference current and the test reference current according to an embodiment of the present disclosure.

Referring to FIG. 5, V_WL may indicate a voltage applied to the word line connected to the memory cells, and I_cell may indicate the value of the cell current of the memory cells measured in the sensing operation.

A read result of the memory cells according to the value of the cell current value when a test voltage Vtest is applied to the word line connected to the memory cells may be shown. The memory cells may include first to third memory cells MC1 to MC3.

In FIG. 5, a test reference current Itrip_test may have a current value higher than a sensing reference current Itrip_ref. When the sensing operation is performed using the sensing reference current Itrip_ref, the first memory cell MC1 may be read as an off cell, and the second and third memory cells MC2 and MC3 may be read as on cells. When the sensing operation is performed using the test reference current Itrip_test, the first and second memory cells MC1 and MC2 may be read as off cells, and the third memory cell MC3 may be read as an on cell.

That is, even though the same test voltage Vtest is applied to the word line with respect to the same memory cells, a read result of the memory cells may vary according to a magnitude of a reference current used during the sensing operation. For example, the second memory cell MC2 may be read as the on cell in the sensing operation using the sensing reference current Itrip_ref, but may be read as the off cell in the sensing operation using the test reference current Itrip_test. The test operation may include a sensing operation performed using the test reference current Itrip_test. After the test operation, an operation of counting the number of memory cells read as off cells in the sensing operation may be performed.

Figure 6:
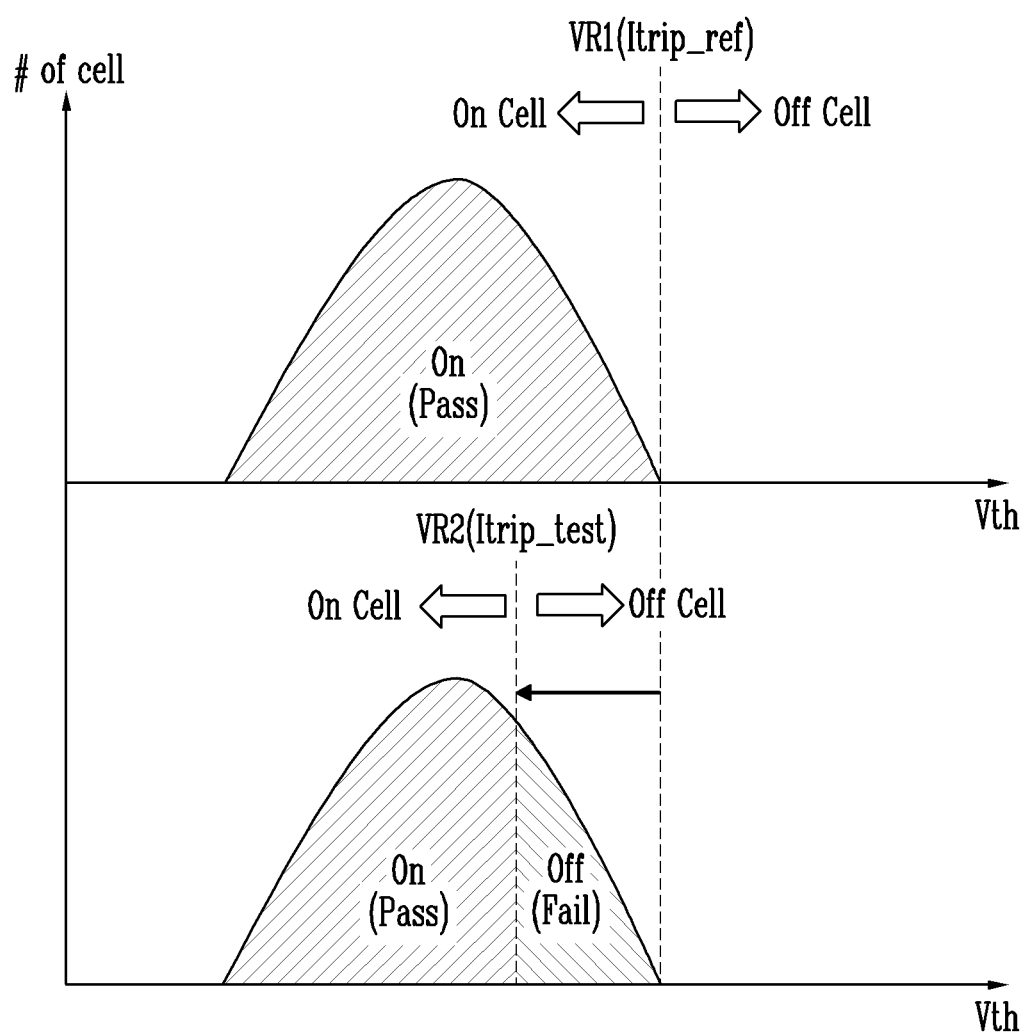
FIG. 6 is a diagram illustrating a fail bit detected in a test operation according to an embodiment of the present disclosure.

FIG. 6 is a diagram illustrating the fail bit detected in the test operation according to an embodiment of the present disclosure.

Referring to FIG. 6, a threshold voltage distribution of the plurality of memory cells may be shown. The number of memory cells read as on cells in the sensing operation may be the number of pass bits. The number of memory cells read as off cells may be the number of fail bits.

When a read voltage VR1 is applied to a word line connected to the plurality of memory cells and the sensing operation is performed using the sensing reference current Itrip_ref, the plurality of memory cells may be read as the on cells.

As described with reference to FIG. 5, when the reference current used in the sensing operation is changed, the same effect as the read voltage is changed may be obtained. That is, even though the same read voltage VR1 is applied to the word line, when the reference current used in the sensing operation is changed from the sensing reference current Itrip_ref to the test reference current Itrip_test, a result of the sensing operation may be the same as a change of the read voltage, which is applied to the word line in the sensing operation using the sensing reference current Itrip_ref, from VR1 to VR2.

For example, when the same read voltage VR1 is applied to the word line connected to the plurality of memory cells and the sensing operation is performed using the test reference current Itrp_test, a portion of the plurality of memory cells may be read as the on cell and others may be read as off cells. At this time, a result of the sensing operation may be the same as a result of the sensing operation performed by applying the read voltage VR2 to the word line connected to the plurality of memory cells and using the sensing reference current Itrip_ref.

That is, by performing the sensing operation using the test reference current Itrip_test higher than the sensing reference current Itrip_ref used in the sensing operation, the number of fail bits may be counted and the defective memory device of which the value of the cell current is less than the threshold value may be easily detected. In an embodiment, a memory device in which the number of fail bits is greater than the reference number may be detected as the defective memory device.

Figure 7:
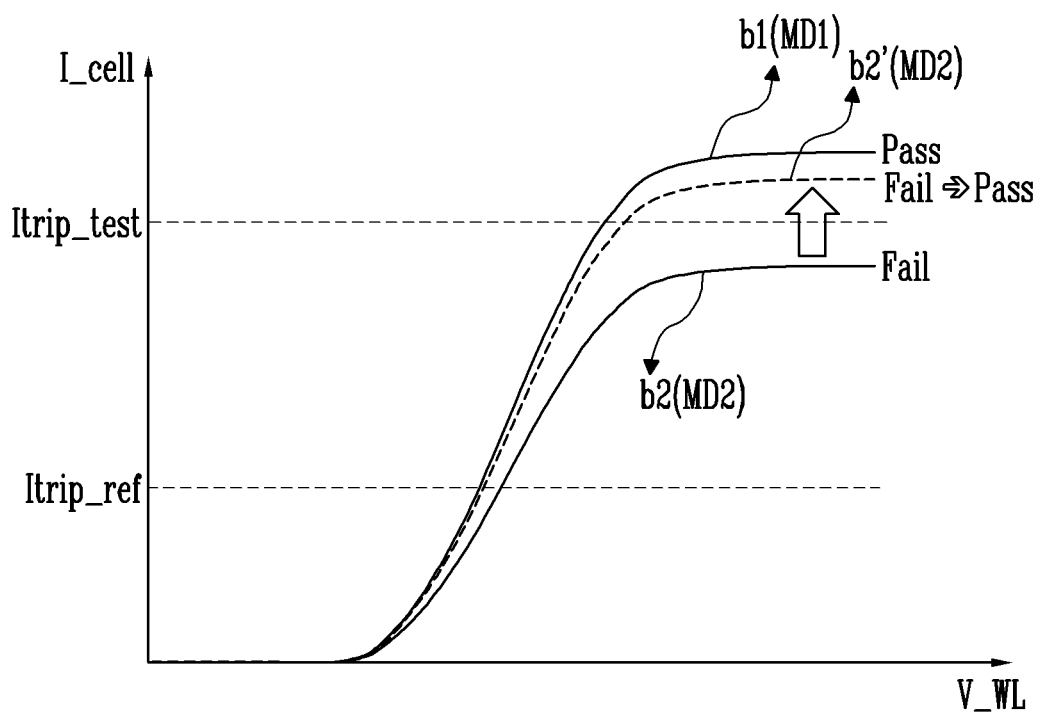
FIG. 7 is a diagram illustrating a result of the test operation according to a change of a bit line voltage according to an embodiment of the present disclosure.

FIG. 7 is a diagram illustrating a result of the test operation according to a change of the bit line voltage according to an embodiment of the present disclosure.

Referring to FIG. 7, a first memory device MD1 may be a normal memory device of which a characteristic of a cell current is satisfactory. A second memory device MD2 may be a defective memory device of which a characteristic of a cell current is poor. b1 may indicate a cell current distribution of the first memory device MD1. b2 and b2' may indicate a cell current distribution of the second memory device MD2.

The test operation may include a sensing operation performed using the test reference current Itrip_test. An operation of counting the number of memory cells read as the off cells in the sensing operation may be performed after the test operation. In the sensing operation, when the value of the cell current is equal to or greater than the test reference current Itrip_test, the result of the test operation on the memory device may be determined as pass. In the sensing operation, when the value of the cell current is less than the test reference current Itrip_test, the result of the test operation on the memory device may be determined as fail.

When the sensing operation is performed using the sensing reference current Itrip_ref, a result of the test operation of both of the first and second memory devices MD1 and MD2 may be determined as pass when referring to b1 and b2. When the sensing operation is performed using the test reference current Itrip_test higher than the sensing reference current Itrip_ref, the result of the test operation of the first memory device MD1 may be determined as pass, but the result of the test operation of the second memory device MD2 may be determined as fail.

The bit line voltage used during the sensing operation on the second memory device MD2 which is the defective memory device may be increased. When the bit line voltage is increased, the value of the cell current may increase and the result of the test operation of the second memory device MD2 may be determined as pass when referring to b2'. The cell current distribution of the second memory device MD2 may be improved from b2 to b2'.

Figure 8:
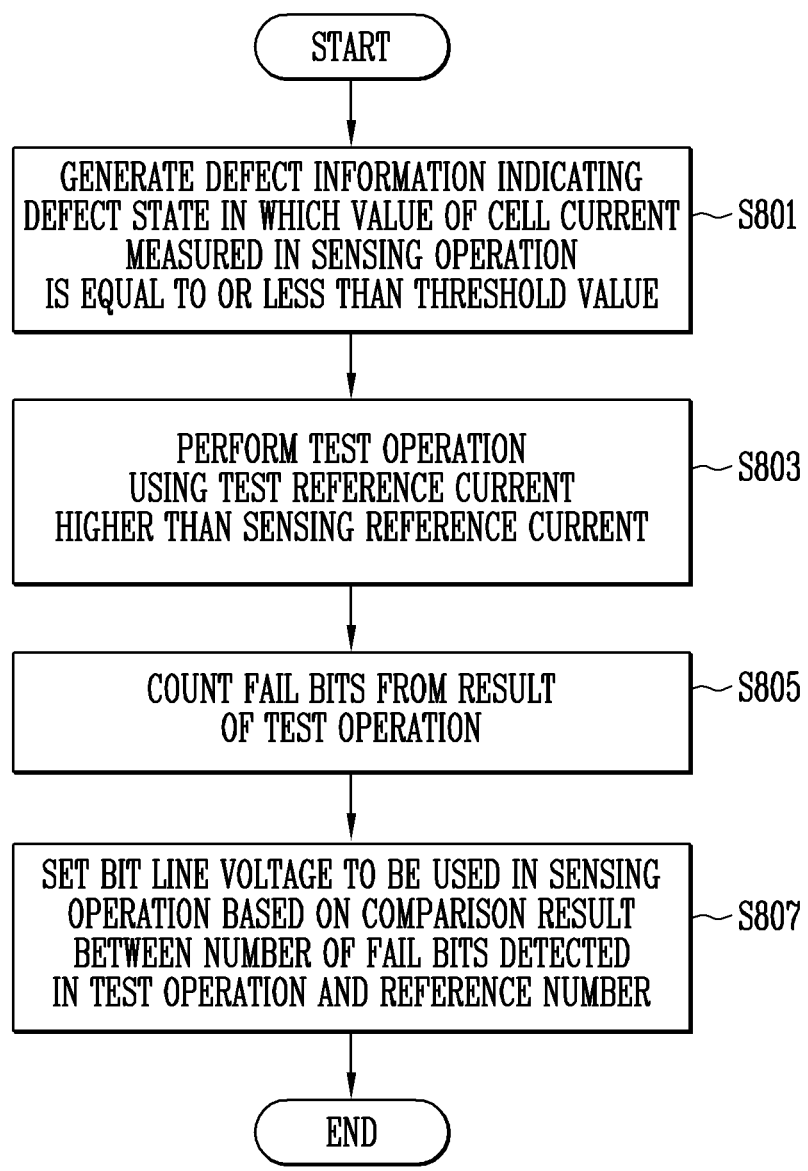
FIG. 8 is a flowchart illustrating an operation of a memory device according to an embodiment of the present disclosure.

FIG. 8 is a flowchart illustrating an operation of a memory device according to an embodiment of the present disclosure.

Referring to FIG. 8, in operation S801, the memory device may generate the defect information indicating the defect state in which the value of the cell current measured in the sensing operation is equal to or less than the threshold value.

In operation S803, the memory device may perform the test operation using the test reference current higher than the sensing reference current.

In operation S807, the memory device may count fail bits from a result of the test operation.

In operation S807, the memory device may set the bit line voltage to be used in the sensing operation based on the comparison result between the number of failed bits detected in the test operation and the reference number.

Figure 9:
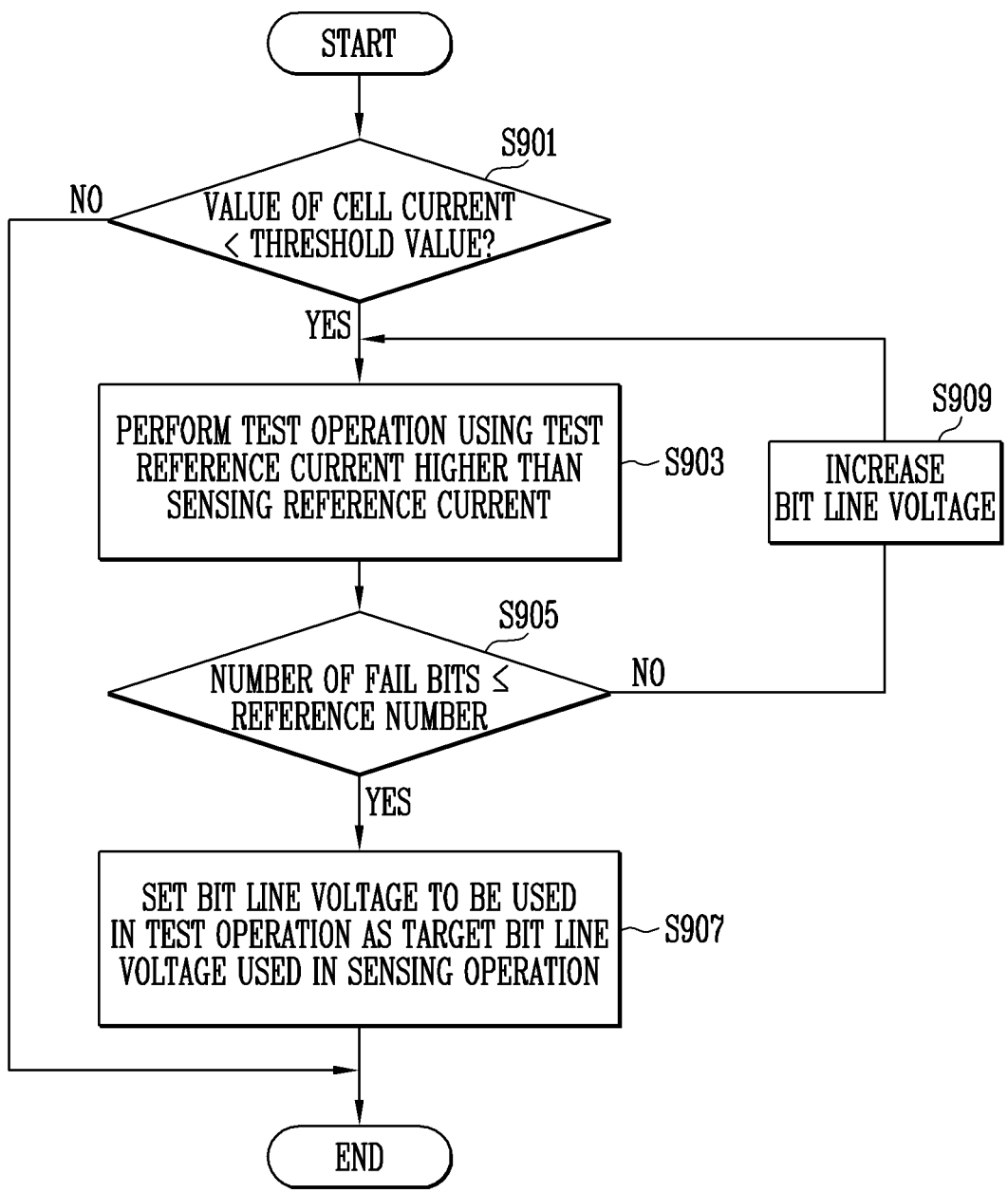
FIG. 9 is a flowchart illustrating an operation of a memory device according to an embodiment of the present disclosure.

FIG. 9 is a flowchart illustrating an operation of a memory device according to an embodiment of the present disclosure.

Referring to FIG. 9, in operation S901, the memory device may determine whether the value of the cell current is less than the threshold value. As a result of the determination, when the value of the cell current is less than the threshold value, the operation proceeds to operation S903, and when the value of the cell current is equal to or greater than the threshold value, the operation is ended.

In operation S903, the memory device may perform the test operation using the test reference current higher than the sensing reference current.

In operation S905, the memory device may determine whether the number of fail bits detected in the test operation is equal to or less than the reference number. As a result of the determination, when the number of fail bits is equal to or less than the reference number, the operation proceeds to operation S907, and when the number of fail bits exceeds the reference number, the operation proceeds to operation S909. When the number of fail bits is equal to or less than the reference number, the result of the test operation may be pass, and when the number of fail bits exceeds the reference number, the result of the test operation may be fail.

In operation S907, the memory device may set the bit line voltage used in the test operation as the bit line voltage to be used in the sensing operation. For example, the memory device may store the information on the bit line voltage used in the passed test operation in the system block. The memory device may change the information on the default bit line voltage used in the sensing operation stored in the system block to the information on the bit line voltage.

In operation S909, the memory device may increase a level of the bit line voltage to be used in the test operation.

What is claimed is:

1. A memory device comprising:
   a plurality of memory cells;
   a defect detector configured to generate defect information indicating a defect state in which a value of a cell current measured in a sensing operation on selected memory cells among the plurality of memory cells is less than a threshold value; and
   a test controller configured to:
   count fail bits from a result of a test operation performed on the selected memory cells using a test reference current in response to the defect information, and
   set a bit line voltage to be used in the sensing operation based on a comparison result between a number of fail bits detected in the test operation and a reference number.

2. The memory device of claim 1, wherein the test operation is performed again using a bit line voltage higher than a bit line voltage used in a previous test operation when the number of the fail bits exceeds the reference number in the previous test operation.

3. The memory device of claim 2, wherein the test operation is repeatedly performed while increasing the bit line voltage used in the test operation until the number of the fail bits is equal to or less than the reference number.

4. The memory device of claim 3, wherein the test controller sets the bit line voltage used in a last one of the repeated test operations as the bit line voltage to be used in the sensing operation when the number of the fail bits becomes equal to or less than the reference number in the last test operation.

5. The memory device of claim 1,
   further comprising a system block configured to store information on a default bit line voltage used in the sensing operation,
   wherein the test controller is further configured to correct the information on the default bit line voltage to information on the set bit line voltage.

6. The memory device of claim 1, further comprising a read and write circuit connected to the plurality of memory cells through a plurality of bit lines and configured to perform the sensing operation and the test operation on the selected memory cells.

7. The memory device of claim 6, wherein the test controller is further configured to:
   generate test information indicating pass or fail of the test operation based on the comparison result between the number of fail bits detected in the test operation and the reference number, and
   control the read and write circuit to perform the test operation using the test reference current higher than a sensing reference current used in the sensing operation in response to the defect information.

8. The memory device of claim 7, wherein the test controller is further configured to control the read and write circuit to repeatedly perform the test operation while increasing a bit line voltage used in the test operation based on the test information.

9. The memory device of claim 7, wherein the test controller is further configured to set parameters including at least one of a level of the bit line voltage to be used in the sensing operation and a time for measuring the cell current in response to the test information.

10. A method of operating a memory device, the method comprising:
    generating defect information indicating a defect state in which a value of a cell current measured in a sensing operation on selected memory cells among a plurality of memory cells is less than a threshold value;
    performing a test operation on the selected memory cells using a test reference current in response to the defect information; and
    setting a bit line voltage to be used in the sensing operation based on a comparison result between a number of fail bits detected in the test operation and a reference number.

11. The method of claim 10, wherein the test reference current is higher than a sensing reference current used in the sensing operation.

12. The method of claim 10, further comprising performing the test operation again using a bit line voltage higher than a bit line voltage used in a previous test operation when the number of the fail bits exceeds the reference number in the previous test operation.

13. The method of claim 12, further comprising repeatedly performing the test operation while increasing the bit line voltage used in the test operation until the number of the fail bits is equal to or less than the reference number.

14. The method of claim 13, wherein the bit line voltage used in a last one of the repeated test operations is set as the bit line voltage to be used in the sensing operation when the number of the fail bits is equal to or less than the reference number in the last test operation.

15. The method of claim 14, further comprising correcting information on a default bit line voltage stored in a system block and used in the sensing operation to information on the set bit line voltage.

16. A memory device comprising:
    a memory cell array;
    a peripheral circuit configured to perform a sensing operation on the memory cell array; and
    a control logic configured to:
    control the peripheral circuit to perform a test operation on selected memory cells within the memory cell array using a test reference current when a value of a cell current measured in the sensing operation is less than a threshold value, and
    set a bit line voltage to be used in the sensing operation based on a comparison result between a number of fail bits detected in the test operation and a reference number.

17. A control circuit comprising:
    a defect detector configured to generate defect information indicating a defect state in which a value of a cell current measured in a sensing operation is less than a threshold value;
    a test processor configured to generate control signals for a test operation of a memory device, the test operation using a test reference current higher than a sensing reference current used in the sensing operation, in response to the defect information;
    a test information generator configured to generate test information indicating pass or fail of the test operation based on a comparison result between the number of fail bits detected in the test operation and a reference number; and a parameter setter configured to set parameters related to the sensing operation in response to the test information.

18. The control circuit of claim 17, wherein the test operation is performed again using a bit line voltage higher than a bit line voltage used in a previous test operation when the number of the fail bits exceeds the reference number in the previous test operation.

19. The control circuit of claim 17, wherein the test operation is repeatedly performed while increasing the bit line voltage used in the test operation until the number of the fail bits is equal to or less than the reference number.

20. The control circuit of claim 19, wherein the parameter setter sets the bit line voltage used in a last one of the repeated test operations as the bit line voltage to be used in the sensing operation when the number of the fail bits becomes equal to or less than the reference number in the last test operation.

21. The control circuit of claim 17, wherein the parameters related to the sensing operation includes at least one of a level of the bit line voltage to be used in the sensing operation and a time for measuring the cell current.

22. A memory device comprising:
a peripheral circuit configured to measure operation cell currents flowing through respective bit lines coupled to a memory cell group by applying an operation voltage to the bit lines; and
a control logic configured to:
control the peripheral circuit to measure test cell currents flowing through the respective bit lines by applying a test voltage to the bit lines,
count, based on the test cell currents, a number of off-cells within the group to determine whether the number is a threshold or less,
repeat, by raising the test voltage, the controlling and the counting until the number becomes the threshold or less, and
update the operation voltage to the test voltage when the number becomes the threshold or less.

* * * * *